United States Patent [19]

Kohl et al.

[11] Patent Number: 4,907,422
[45] Date of Patent: Mar. 13, 1990

[54] HARVEST CYCLE REFRIGERANT CONTROL SYSTEM

[75] Inventors: Vance L. Kohl; Charles E. Schlosser, both of Manitowoc, Wis.

[73] Assignee: The Manitowoc Company, Inc., Manitowoc, Wis.

[21] Appl. No.: 396,932

[22] Filed: Aug. 26, 1989

Related U.S. Application Data

[63] Continuation of Ser. No. 251,803, Sep. 30, 1988, Pat. No. 4,878,361.

[51] Int. Cl.[4] .................................................. F25C 5/10
[52] U.S. Cl. ............................................. 62/352; 62/278
[58] Field of Search .................. 62/81, 151, 277, 278, 62/352

[56] References Cited

U.S. PATENT DOCUMENTS

| | | | |
|---|---|---|---|
| 2,630,685 | 3/1953 | Lewis | 62/81 |
| 2,698,522 | 1/1955 | La Porte | 62/278 |
| 2,876,630 | 3/1959 | Boling | 62/278 |
| 2,960,840 | 11/1960 | Hosken et al. | 62/81 |
| 3,126,715 | 3/1964 | Kocher | 62/151 |
| 3,213,637 | 10/1965 | Halls | 62/352 |
| 3,280,582 | 10/1966 | Knaebel | 62/278 |
| 3,332,251 | 7/1967 | Watkins | 62/278 |
| 3,451,226 | 6/1969 | Shriver | 62/277 |
| 3,651,657 | 3/1972 | Bottum | 62/196.3 |
| 3,677,025 | 7/1972 | Payne | 62/81 |
| 3,838,582 | 10/1974 | Redfern et al. | 62/278 |
| 3,903,709 | 9/1975 | Anderson et al. | 62/149 |
| 3,922,875 | 12/1975 | Morris, Jr. | 62/352 |

OTHER PUBLICATIONS

Service Bulletin No.: SB-18-84, dated: 4/20/84.

Primary Examiner—William E. Tapolcai
Attorney, Agent, or Firm—Leydig, Voit & Mayer

[57] ABSTRACT

An ice making system having a compressor, a condenser and an evaporator, and having freeze and harvest cycles. During the harvest cycle, vaporous refrigerant is circulated from the compressor to the evaporator through a discharge line, and is thereafter returned to the compressor through a supply line. A predetermined amount of refrigerant is condensed in a reservoir during the freeze cycle and expelled therefrom during the harvest cycle to augment the amount of refrigerant circulating in the system.

6 Claims, 2 Drawing Sheets

HARVEST CYCLE REFRIGERANT CONTROL SYSTEM

This is a continuation of U.S. patent application Ser. No. 251,803, filed on Sept. 30, 1988, now U.S. Pat. No. 4,878,361.

FIELD OF THE INVENTION

The present invention relates to ice making systems and, in particular, to a system to augment the amount of vaporous refrigerant circulating between the compressor and evaporator.

BACKGROUND OF THE INVENTION

The basic principles of refrigeration are derived from the behavior of fluid refrigerants when they change from a liquid to a gas, or from a gas to a liquid, and absorb or release latent heat to the environment. Such basic principles have long been utilized in ice making systems. Suitable fluid refrigerants include carbon dioxide and halogenated hydrocarbons.

An ice making system is typically made up of three principle components—a compressor, a condenser, and an evaporator—which generally comprise a closed system. A fourth component—an ice forming mold—is usually placed in close thermal contact with the evaporator.

During the freeze cycle, the compressor receives a vaporous refrigerant at low pressure and compresses it, thus increasing the temperature and pressure of the vaporous refrigerant. The compressor then supplies this high temperature, high pressure vaporous refrigerant to the condenser, where the refrigerant condenses, changing from a vapor to a liquid. In the process of condensing, the refrigerant releases heat to the condenser environment. In a large ice making system, where a considerable amount of heat is released, the condenser is usually located far from the compressor, and typically outdoors.

From the condenser, the liquid refrigerant is supplied to the evaporator, where the liquid refrigerant changes state to a vapor. In the process of evaporating, the refrigerant absorbs latent heat from the surrounding environment. From the evaporator, the refrigerant returns to the compressor. During the freeze cycle, the mold of the typical ice maker is cooled to well below freezing while water is pumped over the mold to build up the desired ice forms.

After the ice has formed, the typical ice maker goes into a harvest cycle in which hot gas from the compressor is fed directly to the evaporator to heat the mold and thus free the formed ice. Because heat from the vaporous refrigerant is used to free the formed ice, ensuring an adequate transfer of heat from the compressor to the evaporator during the harvest cycle is a significant concern, particularly in those situations as described below where an ice maker having a remote condenser is to operate over a range of ambient temperatures.

In many ice making systems which are designed to operate in low temperatures (e.g., below 50° F. ambient), a head pressure control valve is provided, in part, to maintain a minimum head pressure to ensure that compressor heat will be available for the next ice harvest cycle. Such a head pressure control valve is generally designed to back-up liquid refrigerant in the condenser during cold temperatures. This back-up procedure, however, results in extra refrigerant charge being added to the system. As long as the system has enough receiver capacity, this extra refrigerant does not hurt the system during the freeze cycle as the outdoor temperature rises. However, when the ice maker shifts to the harvest cycle, this extra refrigerant can overload the compressor and damage the system.

During the harvest cycle, the vaporous refrigerant is supplied to the evaporator through a hot gas valve which typically has a fixed orifice that acts as a metering device. In self-contained systems with relatively small refrigerant charges, this works satisfactorily and provides acceptable harvest times without returning unacceptable amounts of liquid refrigerant to the compressor. However, in systems having large refrigerant charges (typically where the condenser is remote from the compressor), the discharge pressure during the harvest cycle tends to be much higher at elevated ambient (outdoor) temperatures than the discharge pressure in self-contained systems. This higher pressure causes more refrigerant to flow through the fixed orifice in the hot gas valve and into the cold evaporator where it condenses. If this condensed refrigerant subsequently reaches the compressor, the compressor can become slugged with liquid refrigerant and its efficiency can be materially impaired. The liquid refrigerant can also dissolve the lubricant in the compressor, and wash out the oil in the compressor, resulting-in harmful friction between its moving parts. Reducing the orifice size of the hot gas valve, however, can cause unacceptably long harvest cycles when the discharge pressures are lower, such as occur at low outdoor temperatures.

In a preferred ice making system, a predetermined amount of refrigerant is circulated between the compressor and the evaporator during the harvest cycle. The amount of refrigerant to be circulated would vary from system to system depending upon operating conditions, such as the size of the evaporator. In one such arrangement, disclosed in U.S. patent application Ser. No. 852,523 assigned to The Manitowoc Company, Inc., the amount of refrigerant needed to ensure an efficient harvest cycle is monitored by the compressor's suction pressure, and additional refrigerant from the condenser is added if needed. This arrangement couples a normally closed solenoid with a harvest pressure regulating valve. The normally closed solenoid is open during the harvest cycle to allow vaporous refrigerant to flow to the regulating valve, which is preset to permit refrigerant to flow therethrough only so long as the suction pressure is below a predetermined level.

SUMMARY OF THE INVENTION

A general object of the invention is to provide an ice making system with an effective, economical and simple means for controlling the amount of refrigerant circulating in the system during the harvest cycle. A related object of the invention is to provide a harvest cycle control system that will augment the amount of refrigerant circulating in the system during the harvest cycle and which avoids the use of a harvest pressure regulating valve.

A more specific object of the invention is to provide a reservoir in a typical ice making system which is sized to release a predetermined amount of refrigerant during the harvest cycle.

Another specific object of the present invention is to reduce the chance that liquid refrigerant might enter the compressor cylinders and thus cause valve or head gasket failure. This object is realized by the control of the amount of refrigerant utilized during the harvest cycle, and by the provision that only a small quantity of saturated refrigerant can return to the compressor.

A further object of the invention is to provide an ice making system which is tolerant to refrigerant overcharge situations by ensuring that only the required amount of refrigerant is circulated between the compressor and the evaporator during the harvest cycle.

In accordance with the present invention, these objects are realized by a harvest cycle refrigerant control system comprising a reservoir, means for condensing refrigerant in the reservoir during the freeze cycle, and means for expelling the condensed refrigerant to augment the amount of vaporous refrigerant circulating between the compressor and evaporator during the harvest cycle. Other objects and advantages of the invention will become apparent upon studying the following description and accompanying drawings.

DESCRIPTION OF THE DRAWINGS OF THE INVENTION

In the accompanying drawings, FIG. 1 is a diagram of an ice making system designed in accordance with the present invention.

FIG. 2 is an alternate embodiment of an ice making system, also designed in accordance with the present invention.

DESCRIPTION OF THE PREFERRED EMBODIMENTS OF THE INVENTION

Figure 1:
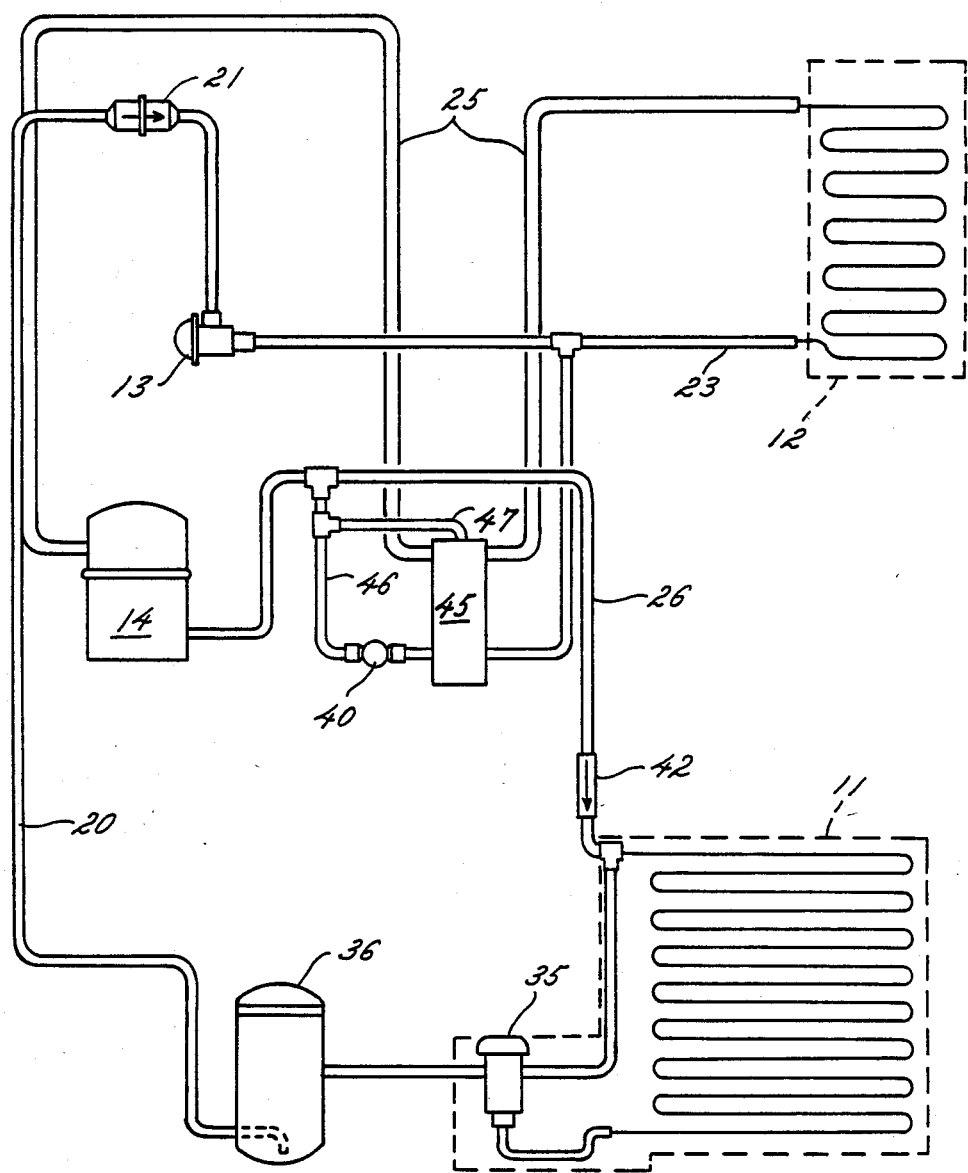

As shown in FIG. 1, the ice making system of the present invention includes a condenser 11, an evaporator 12, an expansion valve 13 and a compressor 14. Although only one evaporator is shown in FIG. 1, the present invention can be applied to an ice making machine having two or more evaporators.

When the ice maker is in the freeze mode, a liquid refrigerant is supplied along a feed line 20 from the condenser through a drier 21 to the expansion valve 13, which serves to lower the pressure of the liquid refrigerant. From the expansion valve 13, the refrigerant is supplied along feed line 23 to the evaporator 12. Within the evaporator 12, the liquid refrigerant evaporates, absorbing heat and thereby cooling the evaporator 12 and anything in thermal contact with it. The vaporized refrigerant is then drawn by the compressor's suction pressure along a supply line 25 into the compressor 14 where it is compressed, increasing both the temperature and pressure of the vaporous refrigerant. From the compressor, the high temperature, high pressure vaporous refrigerant is forced along a discharge line 26 to condenser 11, where the vaporous refrigerant condenses, rejecting heat to the condenser environment.

For large refrigeration systems, which reject a considerable amount of heat, the condenser 11 is often located far from the compressor and typically outdoors. Thus the feed line 20 and the discharge line 26 are frequently quite long. To control the head pressure in the system, a head pressure control valve 35 is provided in the feed line 20 between the condenser 11 and the expansion valve 13. The head pressure control valve 35 is also teed into the discharge line 26 and controls the head pressure by backing up liquid refrigerant into the condenser 11. During cold ambient temperatures, this can result in extra refrigerant being added to the system. A reservoir or "receiver" 36 may be placed between the head pressure control valve 35 and the expansion valve 13 to receive this additional refrigerant.

In practice, so long as the ice making system has sufficient receiver capacity to contain the additional refrigerant needed during lower ambient temperatures, the extra refrigerant does not damage the system during the freeze cycle as the ambient temperature rises. Additional refrigerant, however, could damage the compressor if it is drawn into the evaporators. This can occur during the harvest cycle. In prior ice making systems, when hot vaporous refrigerant is fed directly into the evaporators, the pressure in the condenser will drop, and the liquid refrigerant contained therein, now at a lower pressure, will boil. Unless the condenser is isolated during harvest, vaporous refrigerant can flow back and be drawn into the evaporator, where it will condense and migrate to the compressor.

When the ice making system shown in FIG. 1 goes into harvest, a normally closed hot gas solenoid valve 40 opens, and hot vaporous refrigerant is fed into the evaporator 12. In accordance with the present invention, and in order to prevent vaporous refrigerant from being drawn from the condenser 11 and the receiver 36 during the harvest cycle, a normally open check valve 42 is installed downstream from the point where the hot gas valve 40 is teed into the discharge line 26. The check valve 42 permits the flow of refrigerant from the compressor 14 to the condenser 11 and is closed to flow in the opposite direction during the harvest cycle to prevent the large refrigerant charge in the remote system from flowing to the evaporator 12. However, by preventing the refrigerant in the receiver and condenser from flowing back during harvest, the now isolated circuit between the compressor and evaporator may be low on refrigerant.

To correct this deficiency, a harvest cycle refrigerant control system is provided to add vaporous refrigerant to the now isolated circuit. As shown in FIG. 1, the control system of the present invention includes a reservoir 45, which is disposed between the compressor and the evaporator. The reservoir is teed into hot gas line 46 by connecting tubing 47 at a point between the hot gas valve 40 and the discharge line 26 so that the reservoir communicates with, and may be filled from, the discharge line during the freeze cycle.

The reservoir is preferably a vertically mounted, closed cylinder and is sized to contain a sufficient amount of liquid refrigerant which, when vaporized, will augment the refrigerant circulating between the compressor and the evaporator during the harvest cycle to ensure an efficient harvest. Those skilled in the art will appreciate that it may be necessary to take into account the volume of a portion of connecting tubing 47 when sizing the reservoir. It has been found, for example, that in an ice making system with a rated production of 400 lbs. of ice per day, and having a charge of 16 lbs of R-12 refrigerant, the volume of the reservoir and the tubing 47 connecting the reservoir to the hot gas line 46 should be approximately 6 cubic inches. In an ice making system with a rated production of 1200 lbs. of ice per day, and having a charge of 18 lbs. of R-502 refrigerant, the volume of the reservoir and connecting tubing 47 should be approximately 14 cubic inches.

To ensure that the reservoir is completely filled during the freeze cycle, and as shown in FIG. 1, the reservoir 45 is soldered to, and thus in thermal contact with, a portion of supply line 25. Supply line 25 is cool during the freeze cycle, and will cause the hot vaporous refrigerant flowing through discharge line 26 to condense within the reservoir.

To expel the liquid refrigerant from the reservoir, a portion of hot gas line 46 is soldered to, and thus in thermal contact with, the surface of the reservoir. During the harvest cycle, the hot gas line heats the reservoir 45, causing the liquid refrigerant contained therein to vaporize. Once vaporized, the refrigerant is available to augment the refrigerant circulating between the compressor and the evaporator and, consistent with one aspect of the invention, provides efficient and consistent harvest cycles.

Figure 2:
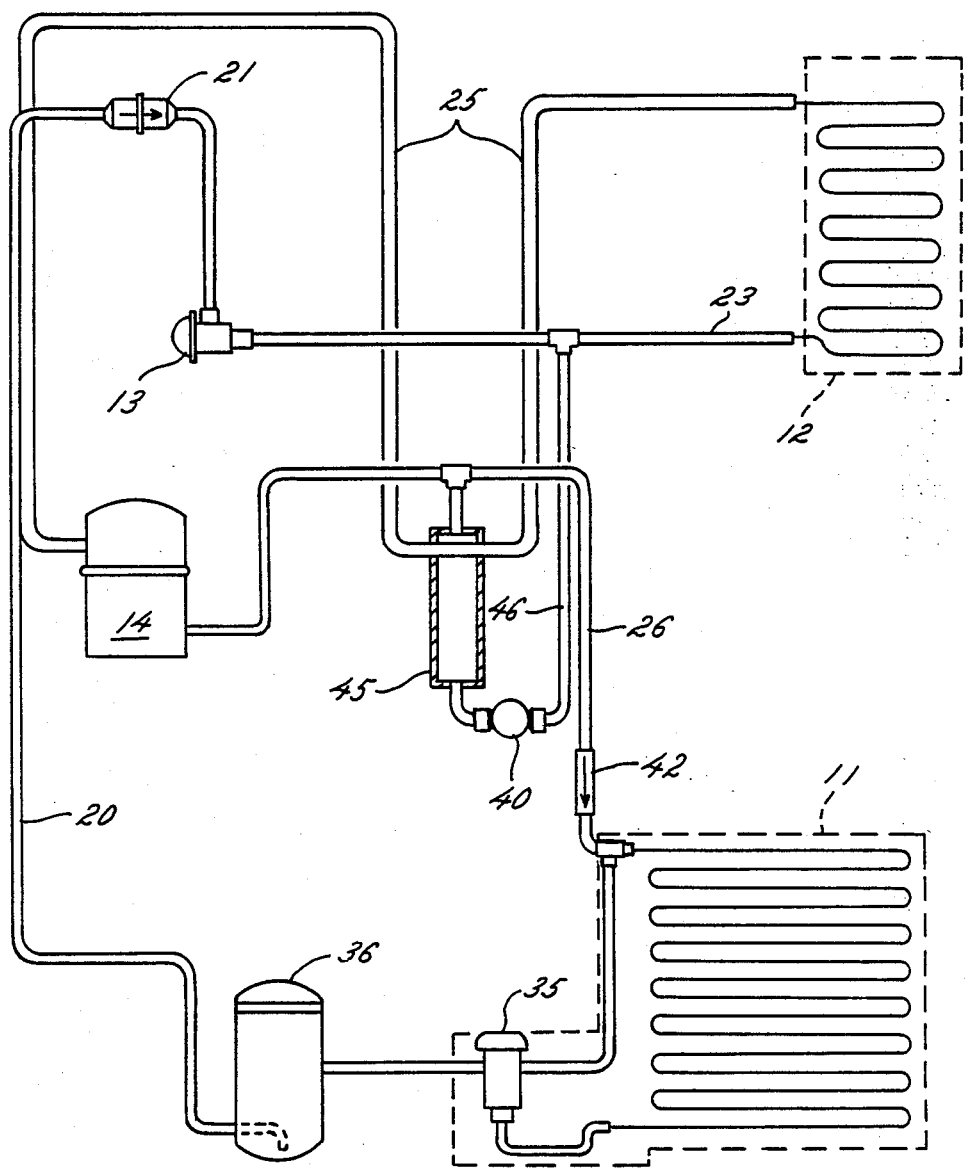

An alternative embodiment of the harvest cycle control system of the present invention is shown in FIG. 2. As best shown therein, the reservoir 45 is disposed in hot gas line 46 between the discharge line 26 and the hot gas valve 40. The supply line 25 passes through the reservoir, and causes hot, vaporous refrigerant to condense in the reservoir during the freeze cycle. The condensed refrigerant is then expelled from the reservoir when the hot gas valve is opened at the start of each harvest cycle.

While the harvest cycle refrigerant control system has been described in the context of an ice making system, the invention can be used in a wide variety of refrigeration systems, and is consequently not limited to the embodiments described herein. It should be understood that alternative embodiments and modifications which would still be encompassed by the invention may be made by those skilled in the art, particularly in light of the foregoing teachings. The following claims are consequently intended to cover any alternative embodiments, modifications, or equivalents which may be included within the spirit and scope of the invention as claimed.

We claim as our invention:

1. In an ice making system having a compressor, a condenser and an evaporator and having both a freeze cycle wherein a refrigerant is circulated from the compressor to the condenser through a discharge line and thereafter circulated to the evaporator and returned to the compressor through a supply line and a harvest cycle wherein a refrigerant is circulated from the compressor to the evaporator through the discharge line and a hot gas line and thereafter returned to the compressor through the supply line, a normally closed hot gas valve disposed between the compressor and the evaporator in the hot gas line, said hot gas valve being open during the harvest cycle to permit the flow of vaporous refrigerant therethrough, a check valve disposed between the condenser and the compressor, said check valve preventing the backflow of refrigerant from the condenser to the evaporator during the harvest cycle, a reservoir disposed between the compressor and the evaporator and communicating with the discharge line, means for condensing refrigerant in the reservoir during the freeze cycle, said means for condensing refrigerant comprising a portion of the supply line which is cool during the freeze cycle and which is in thermal contact with a portion of the reservoir, and means for expelling the condensed refrigerant from the reservoir to augment the amount of vaporous refrigerant circulating between the compressor and the evaporator during the harvest cycle, said expelling means comprising a surface which is warm during the harvest cycle and which is in thermal contact with a portion of the reservoir.

2. The ice making system defined in claim 1 wherein the reservoir is teed into the hot gas line by a connecting tube at a point between the hot gas valve and the discharge line so that the reservoir communicates with and may be filed with refrigerant from the discharge line during the freeze cycle.

3. In an ice making system having a compressor, a condenser and an evaporator and having both a freeze cycle wherein a refrigerant is circulated from the compressor to the condenser through a discharge line and thereafter circulated to the evaporator through a feed line and returned to the compressor through a supply line and a harvest cycle wherein a refrigerant is circulated from the compressor to the evaporator through a circuit bypassing the condenser and is thereafter returned to the compressor through the supply line, a normally closed hot gas valve disposed in the bypass circuit in a hot gas line between the compressor and the evaporator, said hot gas valve being opened during the harvest cycle to permit the flow of vaporous refrigerant therethrough, a check valve disposed in the discharge line between the condenser and the compressor, said check valve preventing the back flow of refrigerant from the condenser to the evaporator during the harvest cycle, a reservoir disposed in the bypass circuit between the compressor and the evaporator and communicating with the discharge line, means for condensing refrigerant in the reservoir during the freeze cycle, said condensing means comprising a surface which is cool during the freeze cycle, and which is in thermal contact with a portion of the reservoir, and means for expelling the condensed refrigerant from the reservoir to augment the amount of vaporous refrigerant circulating between the compressor and the evaporator during the harvest cycle, said expelling means comprising a surface which is warm during the harvest cycle and which is in thermal contact with a portion of the reservoir.

4. The ice making system defined in claim 3 wherein the reservoir is teed into the hot gas line by a connecting tube at a point between the hot gas valve and the discharge line so that the reservoir communicates with and may be filled with refrigerant from the discharge line during the freeze cycle.

5. The ice making system defined in claim 4 wherein the bypass circuit comprises the reservoir, the hot gas valve and the hot gas line and is teed into the feed line.

6. The ice making system defined in claim 3 wherein the surface which is cool during the freeze cycle is the supply line, and the surface which is warm during the harvest cycle is the hot gas line.

* * * * *